United States Patent [19]
Burnett et al.

[11] Patent Number: 4,694,269
[45] Date of Patent: Sep. 15, 1987

[54] MAGNET SYSTEM AND METHOD OF ITS MANUFACTURE

[75] Inventors: Sibley C. Burnett; John R. Purcell, both of San Diego; M. Harlan Horner, Del Mar, all of Calif.

[73] Assignee: GA Technologies Inc., San Diego, Calif.

[21] Appl. No.: 638,876

[22] Filed: Aug. 8, 1984

[51] Int. Cl.⁴ .............................................. H01F 7/22
[52] U.S. Cl. ................................... 335/216; 335/299; 324/319; 29/599
[58] Field of Search .................. 335/299, 216; 29/599, 29/605; 324/319, 320

[56] References Cited

U.S. PATENT DOCUMENTS

| | | | |
|---|---|---|---|
| 3,391,362 | 7/1968 | Albrecht et al. | 335/216 |
| 3,394,330 | 7/1968 | Schindler | 335/299 X |
| 3,559,130 | 1/1971 | Schrader | 335/299 X |

Primary Examiner—George Harris
Attorney, Agent, or Firm—Fitch, Even, Tabin & Flannery

[57] ABSTRACT

A magnet system for providing a localized, substantially homogeneous magnetic field for use in nuclear magnetic resonance imaging. The magnet system includes a vacuum vessel defining a bore for receiving the subject of the imaging. It further includes a cryogenic containment vessel supported within the vacuum vessel. A single coil or "simple" solenoid is positioned within the containment vessel for providing the magnetic field. This coil includes a winding made up of thousands of turns of small superconductive wire, with the winding having a modular geometry including a plurality of axially spaced wire modules. The coil further includes an insulative substance, having a greater coefficient of thermal contraction than that of the wire, distributed in the winding. As the temperature of the coil is reduced from room temperature to its cryogenic operating temperature, the development of localized stress concentrations of sufficient magnitude to rupture the wire, are avoided. A method of winding the coil is also disclosed.

17 Claims, 4 Drawing Figures

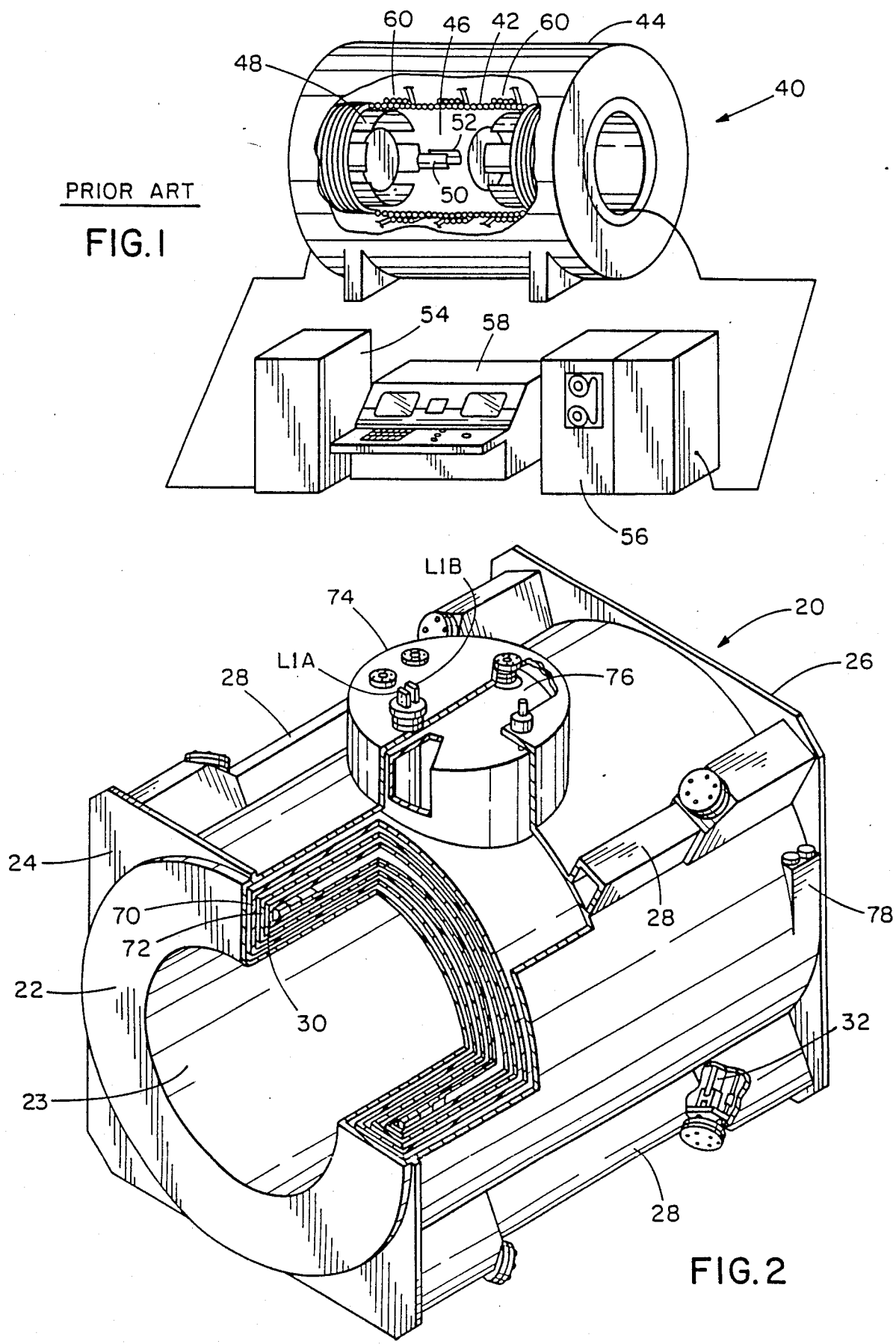

4,694,269

MAGNET SYSTEM AND METHOD OF ITS MANUFACTURE

BACKGROUND OF THE INVENTION

The present invention relates to apparatus for providing a magnetic field and, more particularly, to a magnet having a superconductive coil for providing a region having a very homogeneous magnetic field of relatively high flux density.

One of the main areas of application for a magnet providing a region having a substantially homogeneous magnetic field with high flux density is in equipment making use of the phenomenon of nuclear magnetic resonance (NMR) imaging. One such piece of equipment for medical diagnosis provides information comparable to that provided by a computerized axial tomography scanner but without subjecting the patient undergoing examination to potentially harmful X-rays. Additionally, an NMR imaging system offers other advantages over a computerized axial tomography scanner in that the operation of the former is not affected by the presence of bone. Ultimately the patient can safely remain in place long enough, and the NMR imaging system can be designed to have sufficient resolution to allow observation of the body's take up of a drug.

It has been recognized that the magnetic field provided by prior art simple solenoid coils is not usually sufficiently homogeneous for NMR imaging. One prior art magnet for NMR imaging incorporated a superconductive solenoid coil for generating a field of the desired strength, and further included a number of separate room temperature correction coil windings precisely positioned at predetermined locations inside the warm bore along the length of the solenoid to correct for nonuniformity in field strength. Available mathematics permit computation as to the the number of turns and the identification of the precise locations of these correction coils to achieve the desired field homogeneity at the center of the magnet bore, which must have a deviation in field strength of approximately twenty-five parts per million for proper NMR imaging.

In another prior art magnet, a superconducting solenoid is employed having a field-shaping member made of a metal having high magnetic saturation. The field-shaping member functions to prevent production of localized regions of high magnetic filed strength at inner points of the superconducting winding. The field shaper interacts with the magnetic filed lines in the localized region and directs the field lines to form a resultant substantially uniform strong field along the axis of the solenoid. Reference may be made to U.S. Pat. No. 3,177,408 for a further description of the structure and operation of this magnet.

SUMMARY OF THE INVENTION

Among the several aspects of the present invention may be noted the provision of an improved magnet system suitable for NMR imaging. The magnet system of the present invention avoids the use of separate homogeneity correction coils. The single magnet winding has a unique geometry which avoids damage such as breakage of the wire due to localized stress concentrations resulting from differential thermal contraction of the insulative and conductive materials of the winding. The magnet system of the present invention is relatively easy and economical to manufacture, is reliable in use and has long service life. Other aspects and features of the present invention will be, in part, apparent and, in part, pointed out hereinafter in the following specification and in the attendant claims and drawings.

Briefly, the magnet of the present invention includes a vacuum vessel, a cryogenic containment vessel supported within the vacuum vessel, and a multiple turn coil or "simple solenoid" disposed within the containment vessel for providing the magnetic field. The vacuum vessel defines a bore for receiving the subject of the imaging. The coil includes a winding made up of thousands of turns of small superconductive wire. The winding has a modular geometry including a plurality of axially-spaced wire modules. The coil further includes an insulative substance having a greater coefficient of thermal contraction than that of the wire, which substance is distributed in the winding. Thus, as the temperature of the coil is reduced from room temperature to its cryogenic operating temperature, the development of localized stress concentrations sufficient to rupture the wire are avoided.

As a method of winding a superconductive coil to provide a region of substantially homogeneous high field strength, the present invention includes the following steps:

A. A tube, which is to form the inner wall of a cryogenic vessel, is placed to serve as a bobbin.

B. A module of wire is wound adjacent one end of the bobbin.

C. Wire modules are wound in sequence from the first completed wire module toward the other end of the bobbin.

BRIEF DESCRIPTION OF THE DRAWINGS

FIG. 1 is a simplified system diagram, partially block in nature, of prior art nuclear magnetic resonance (NMR) imaging apparatus;

FIG. 2 is an isomeric projection of an NMR imaging magnet of the present invention, including a vacuum vessel, with certain components removed to expose other components;

Corresponding reference characters indicate corresponding components throughout FIGS. 2–4.

DESCRIPTION OF THE PREFERRED EMBODIMENT

Figure 3:
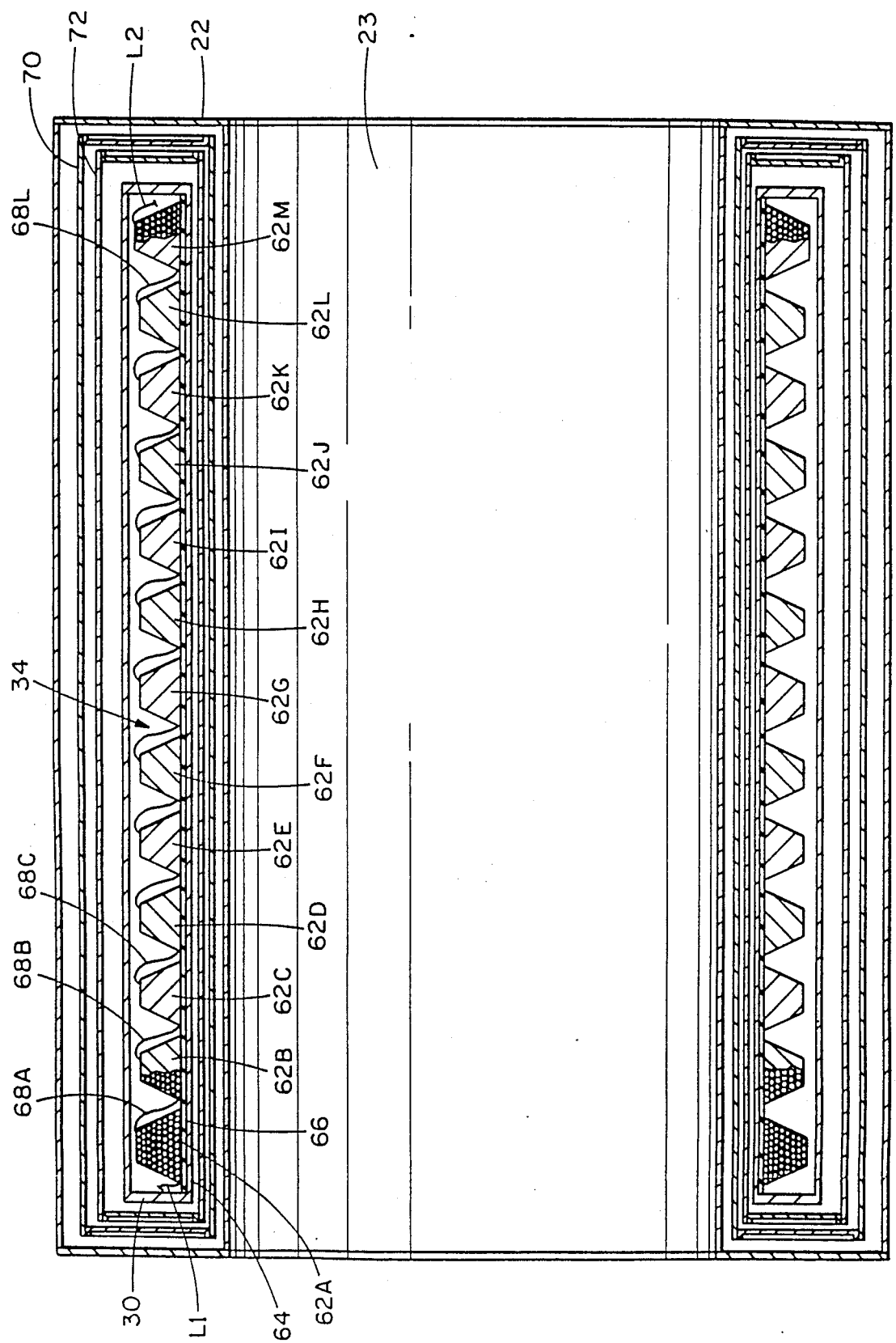
FIG. 3 is a cross-sectional view of the vacuum vessel of FIG. 2 and the magnet components it encloses, showing the modular geometric profile of the winding of the magnet used to achieve intrinsic localized field homogeneity.

Referring now to FIG. 2, one preferred embodiment of the magnet system of the present invention is generally indicated at reference character 20. The magnet system 20 includes a substantially cylindrical vacuum vessel 22 defining a bore 23 for receiving the subject (patient) of the imaging. Attached, for example by welding, adjacent the ends of the vacuum vessel are end plates 24, 26 with regularly spaced beam-like reinforcements 28 extending axially to interconnect corresponding corners of the end plates. Supported inside the vacuum vessel is a substantially cylindrical cryogenic containment vessel 30. The vessel 30 is preferably supported by a series of straps 32 each of which is anchored by an enlarged end of reinforcement 28. A preferred material for the straps is a fiberglass-epoxy composite which has sufficient strength characteristics to enable the magnet system to be sited in a vehicle. Each strap is provided with an adjustment mechanism to permit selective tensioning. Such adjustment mechanisms are well known to those of skill in the art and need not be further discussed here.

As best shown in FIG. 3, a single coil 34 is disposed within the containment vessel for providing a localized, substantially homogeneous magnetic field within at least a portion of the bore 23. The coil is formed by tens of thousands of turns of superconductive wire, preferably having a diameter of between about 10 and 30 mils. The term "single coil" is to be accorded its broad meaning that the various turns of the coil are all in series so that the same current flows through all the turns. It will be appreciated that by using state of the art computer aided design/computer aided manufacturing techniques and equipment, very accurate location of each turn can be achieved. Thus, a single coil can be used to provide a localized area ( at the center of the bore) of high field strength, at least 0.35 Tesla, and of sufficient homogeneity, the deviation in field strength being no more than 25 parts per million, for use in NMR imaging.

Referring now to FIG. 1, prior art NMR imaging apparatus 40 is shown including a superconducting magnet assembly having a main field winding 42 disposed within a cylindrical vacuum vessel 44 which also houses a cryogenic system. The vessel 44 defines a bore 46, which is at room temperature, and within which is supported gradient coils 48 that generate the relatively weak, rapidly changing magnetic field gradients needed for spatial definition. Placed at an inner location in the bore 46 is a radio frequency antenna formed by curved panels 50 and 52. Shown interconnected with the superconducting magnet assembly are power supplies 54, data acquisition and processing equipment 56 and a display and control panel 58. For further information regarding NMR imaging and the prior art apparatus for use in carrying out the imaging, reference may be made to the following:

(A) "Nuclear Magnet Resonance: WIP" by Crooks et al., *Radiology*, Vol 143, pp. 169–174, April 1982.

(B) "Principles of NMR Imaging" by Pyckett, et al., *Radiology*, Vol 143, pp. 157–168, April 1982.

(C) "NMR Imaging in Medicine" by Ian L. Pyckett, *Scientific American*, May 1982.

The prior art magnet system also includes sets of correction coils 60 wound adjacent the main winding 42. The correction coils could be superconductive or they could be resistive "shim" coils. These coils (which are shown disposed outside the main winding but which also could be located interiorly thereof) require energization through connection to the power supplies 54 and each coil or type of coil is for a specific purpose and requires careful and precise location. For example, there could be axial correction coils, radial correction coils and correction coils designed for a specific order of defect along a specific axis. For further information regarding such prior art correcting coils and the calculations required for their design, reference may be made to "NMR Spectrometry in the High Fields" by Sauzade and Kan, *Advances in Electronics and Electron Physics*, Vol. 34, pp. 26–55, 1973.

Referring to FIG. 3, the coil 34 of the magnet 20 of the present invention includes a winding having a modular geometry having a plurality of axially-spaced wire groupings or modules 62A–62M. While is is possible to construct a winding without the modular geometry, that is, a winding wound in layers extending from one end of the containment vessel to the other, this single layer wound, profiled solenoid geometry has been found to have a significant disadvantage which requires some explanation. It is noted that much of the structure of a magnet system incorporating a non-modular winding geometry is quite similar to the structure of the magnet system of the present invention incorporating a modular winding. For ease and clarity of explanation, the discussion of the next few paragraphs (relating to the magnet system with a non-modular winding) may refer to structural components of the present magnet system with the modular winding.

A single winding coil of non-modular geometry designed to provide intrinsic homogeneity (does not require separate homogeneity correction coils) can be wound using the inner wall 64 of what will later be formed into the containment vessel 30, as a bobbin. An insulative layer 66, preferably wound of an epoxy fiberglass composite, is provided on top of the wall 64 to provide a winding surface. The laying of the magnetic field strength portion of the coil proceeds in layers, with each layer starting adjacent one end of the bobbin and proceeding to adjacent the other end, and then back and forth. Each layer may include well over two thousand turns of superconductive wire and there could be more than 10 layers. After completion of the magnetic field strength portion of the winding, the field correction or homogeneity turns are wound on top of the completed layers.

To achieve the necessary filed strength and homogeneity, it is necessary that each turn be located precisely and that it not move after positioning. In order to achieve and maintain positive location of each turn, an epoxy resin is used as a turn layup compound. Such compounds are well known to those of skill in the winding art and these compounds are used extensively because of their adhesion and the high strength provided. Additionally, sheets of insulative materials, also preferably including epoxy resin, are positioned on top of completed layers to reestablish a substantially "flat" or non-undulating winding surface for the next layer. Accordingly, the completed coil contains not only the wire, but also a substantial portion of an insulative substance—mainly epoxy resin. Unfortunately, copper and epoxy have vastly different coefficients of thermal contraction. In reducing the coil temperature from room temperature to the cryogenic operation temperature (about 4° K.), copper contracts about 3 mils/inch while epoxy contracts about 17 mils/inch. The wound coil may be approximately eighty inches long, too long to withstand the stress concentrations resulting from this differential thermal contraction.

As a consequence, the intrinsic homogeneity coil with non-modular geometry fails structurally during cooling because radially extending cracks form to relieve the stresses. This crack formation results in turns dropping from their proper layer, the shorting of adjacent turns or rupture of the wire in possibly numerous locations. A cracked coil may or may not perform satisfactorily for a one-time experimental use. It is, however, not acceptable for commercial diagnostic applications where high reliability is mandatory.

Referring to FIG. 3, the coil of the present invention includes the winding of modular geometry including the axially-spaced wire modules 62A–62M precisely for the reason of avoiding the problems of crack formation during cooling to the cryogenic operating temperature. Each module can be considered as including a predetermined number of turns supported in predetermined locations in an insulative matrix. While a coil having a length of eighty inches cannot withstand the differential thermal contraction without cracking, a "subcoil" or wire module having an axial length of, for example, nine inches can easily withstand the stresses generated without structural failure. Certain of the wire modules include both strength turns, to aid in establishing a field of at least a predetermined strength, and homogeneity or correction turns, which aid in establishing a substantially homogeneous field at a location including the center of the magnet bore 23. Preferably each module includes both types of turns. Adjacent modules are preferably fully separated by a small space for voltage standoff. The number of wire groupings may be five or possibly fewer. Wire groupings in the range of 10 to 15 are preferable with 13 being the number of groupings found most preferable for a specific 80 inch embodiment. The number of groupings, of course, is unlimited. However, the greater the number, the more difficult the design calculations and the actual winding.

Figure 4:
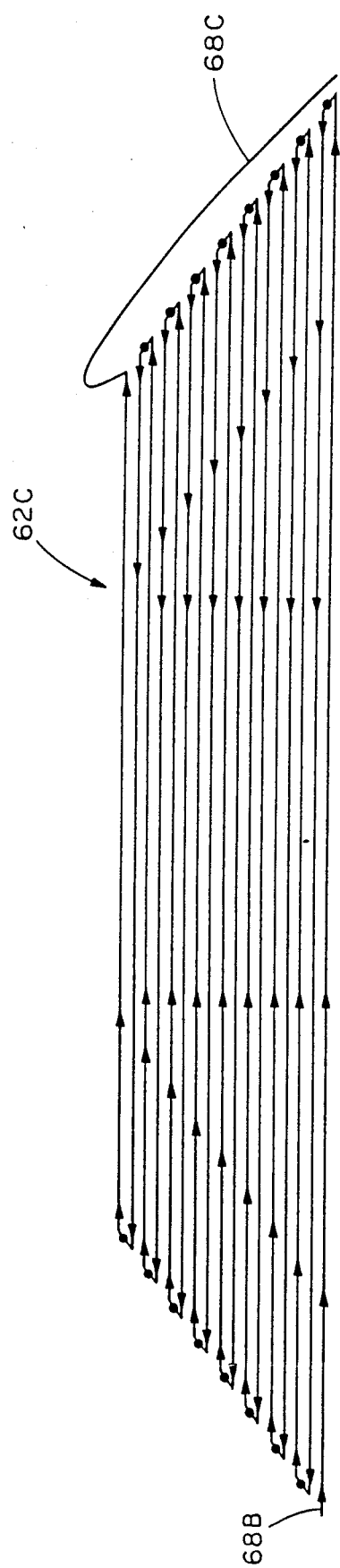
FIG. 4 is a coil map of an exemplary module of the winding used in the device shown in FIG. 3.

A winding map of an exemplary wiring group of module 62C is shown in FIG. 4. In section, the wire grouping is trapezoidal in cross section with the sides converging away from the bore. These would intersect a plane normal to the axis of the bore at an angle preferably between 30 degrees and 60 degrees. Winding with a more severe angle could result in a turn at the end of a layer dropping to a lower layer while winding at a milder angle results in unnecessary lengthening of the coil and lessening of homogeneity. After completion of the top layer of module 62B, a transition turn 68B is wound to bring the wire into proper position to commence winding the lowest layer of module 62C. This lowest layer could contain 225 turns with each succeeding subsequently layed upper layer containing generally proportionally fewer turns and with the top layer mainly including correction turns which might number about 100. Upon completion of module 62C, the transitional turn 68C is placed to move the winding machine into position to start fabrication of module 62D. Thus, the modules are completed from one end of the bobbin to the other, forming a single intrinsically homogeneous coil having leads L1, L2.

Referring to FIGS. 2 and 3, the magnet system further includes a pair of radiation shields 70, 72, which are disposed inside vessel 22 and contain the coil containment vessel 30. These radiation shields serve to reflect thermal energy from outside the vacuum vessel that would otherwise radiate to liquid helium which is included with the coil in the containment vessel 30. The tension members or straps 32, used to support the shields and the containment vessel 30 inside the vacuum vessel, are preferably of a fiberglass-epoxy construction, so as not to conduct heat well. Space between the various vessels and shields may contain so-called "superinsulation" formed of insulating material, such as aluminized polyester fiber, which further reduces the transmission of thermal energy to the liquid helium.

As shown in FIG. 2, mounted on the outer vacuum vessel 22 is an enclosure 74, housing a liquid nitrogen vessel 76, which also contains the necessary electrical switching equipment for controlling operation of the coil. Provided for by the enclosure are power leads L1A, L1B, liquid nitrogen boil-off and fill ports and a helium boil-off vent. The outer vacuum vessel 22 has an extension 78 for liquid helium cool-down and fill ports. The magnet system also contains the necessary plumbing to convey liquid helium and liquid nitrogen to their proper locations and to vent their gasses; however, such plumbing and related hardware are well known to those of skill in the art and not need be further discussed here.

A superconducting high magnetic field magnet system with a 50 centimeter diameter spherical region of substantially homogeneous field, constructed in accordance with the teachings of the present invention, might have a width of 1.7 meters so that it could easily be brought in through typical double doors found in hospitals. The overall length of the magnet would be in the order of 2.3 meters. The magnet could have a 1 meter diameter cavity for entrance of the patient to undergo diagnosis. The walls of the containment vessel 30 as well as the walls of the vacuum vessel 22 are preferably fabricated of stainless steel while a preferable construction material for the radiation shields is an aluminum alloy. The coil may include approximately fifty thousand turns of small superconductive wire which could be energized sufficiently to provide a magnetic field of strength of approximately 0.5 Tesla with a localized area of homogeneity including the center of the cavity having a deviation of less than 2 or 3 parts per million.

As a method of winding a superconductive coil for a magnet system to provide a localized, substantially homogeneous, high strength magnetic field, suitable for nuclear magnetic resonance imaging at a predetermined location within the bore of the magnet system, the present invention comprises several steps:

A. A cylindrical tube 64, to form the inner wall of a coil containment vessel 30, is placed to serve as a bobbin and an insulation layer 66 is laid thereon.

B. A completed wire module is wound adjacent one end of the bobbin.

C. Remaining wire modules are completely wound sequentially from the first completed wire grouping toward the other end of the bobbin.

In view of the above, it will be seen that the several objects of the invention are achieved and other advantageous results attained.

As various changes could be made in the above construction without departing from the scope of the invention, it is intended that all matter contained in the above description or shown in the accompanying drawings shall be interpreted as illustrative and not in a limiting sense.

What is claimed is:

1. A magnet system for providing a localized, substantially homogeneous magnetic field for use in nuclear magnetic resonance imaging, said magnet system comprising:

a vacuum vessel defining a bore for receiving the subject of the imaging;

a cryogenic containment vessel supported within said vacuum vessel; and a single coil disposed within said containment vessel for providing said magnetic field, said coil comprising a winding made up of thousands of turns of small superconductive wire, said winding having a modular geometry including a plurality of axially serially disposed modules with space provided between adjacent modules, said coil further comprising an insulative substance, having a different coefficient of thermal contraction than that of said wire, distributed in said winding whereby as the temperature of said coil is reduced from room temperature to its cryogenic operating temperature, the development of localized stress concentrations sufficient to structurally damage the coil, are avoided.

2. A magnet system as set forth in claim 1 wherein certain of said modules comprise strength turns which function to aid in establishing a magnetic field of at least a predetermined field strength at a predetermined location in said bore, said certain modules each further comprising homogeneity turns which aid in establishing a substantially homogeneous field at said predetermined location.

3. A magnet system as set forth in claim 2 wherein each of said modules includes both said strength turns and said homogeneity turns.

4. A magnet system as set forth in claim 1 wherein the field strength is at least 0.35 Tesla and the degree of deviation in field strength is less than twenty-five parts per million.

5. A magnet system as set forth in claim 1 wherein adjacent modules have only a single interconnection.

6. A magnet system as set forth in claim 1 wherein said insulative substance includes an epoxy resin turn positioning compound.

7. A magnet system as set forth in claim 1 wherein the number of said modules is at least 5.

8. A magnet system as set forth in claim 7 wherein the number of said modules is between 10 and 15.

9. A magnet system as set forth in claim 1 wherein said wire has a diameter in the range of 10 to 30 mils.

10. A magnet system as set forth in claim 1 wherein said containment vessel contains a cryogenic coolant.

11. A magnet system as set forth in claim 10 wherein said magnet system comprises at least one radiation shield within said vacuum vessel and encompassing said containment vessel.

12. A magnet system as set forth in claim 1 wherein each of said wire groupings has axially spaced sides, converging in a radial direction away from said bore.

13. A magnet system as set forth in claim 12 wherein extensions of said sides would intersect a plane extending normal to the axis of said magnet, at angles between 30 and 60 degrees.

14. A magnet system as set forth in claim 1 wherein both said vacuum vessel and said containment vessel are substantially cylindrical.

15. A magnet system as set forth in claim 5 wherein said coil includes substantially no wire turns other than those included in said groupings and their interconnections.

16. A method of winding a superconductive coil for a magnet to provide a localized, substantially homogeneous, high strength magnetic field, suitable for nuclear magnetic resonance imaging, at a predetermined location within a bore of said magnet, by winding a series of axially spaced wire modules with at least some of said modules including both strength turns functioning to aid in establishing a field of at least a predetermined strength, and homogeneity turns for aiding in establishing a substantially homogeneous field at said predetermined location, said method comprising the following steps:
A. placing a tube, to form the inner wall of a coil containment vessel, to serve as a bobbin;
B. winding a completed wire module adjacent one end of said bobbin; and
C. sequentially winding completed wire groupings from the first completed wire grouping toward the other end of said bobbin.

17. A magnet system for providing a localized, substantially homogeneous magnetic field for use in nuclear magnetic resonance imaging, said magnet system comprising:
a vacuum vessel having a bore for receiving the subject of the imaging;
a cryogenic containment vessel supported within said vacuum vessel;
a single coil disposed within said containment vessel for providing said magnetic field, said coil comprising a winding made up of thousands of turns of small superconductive wire, said winding having a modular geometry including a plurality of axially serially disposed modules with space provided between adjacent modules, each module comprising a predetermined number of turns supported in predetermined locations in an insulative matrix, material forming said matrix having a different coefficient of thermal contraction than that of said wire, the axial length of each module being limited so that as the temperature of said coil is reduced from room temperature to its cryogenic operating temperature, localized stress concentration are insufficient to cause structural damage.

* * * * *

UNITED STATES PATENT AND TRADEMARK OFFICE
CERTIFICATE OF CORRECTION

PATENT NO. : 4,694,269
DATED : September 15, 1987
INVENTOR(S) : Sibley C. Burnett et al.

It is certified that error appears in the above-identified patent and that said Letters Patent is hereby corrected as shown below:

Column 1, line 50, change "filed" to --field--.
Column 2, line 38, change "isomeric" to --isometric--.
Column 2, line 68, after "of" insert --a--.
Column 3, line 44, change "Pyckett" to --Pykett--.
Column 3, line 46, change "Pyckett" to --Pykett--.

Column 4, line 3, after "single" insert --,--.
Column 4, line 32, change "filed" to --field--.
Column 4, line 68, change "problems" to --problem--.
Column 6, line 22, after "field" delete "of".

Signed and Sealed this

Third Day of May, 1988

*Attest:*

DONALD J. QUIGG

*Attesting Officer*

*Commissioner of Patents and Trademarks*